455-73 SR

6/16/87 XR 4,673,830

United States Patent [19]

Giorgetta et al.

[11] Patent Number: 4,673,830

[45] Date of Patent: Jun. 16, 1987

[54] BIASING NETWORK FOR MULTIFUNCTION BIPOLAR INTEGRATED SYSTEM

[75] Inventors: Valerio Giorgetta, Turin; Vanni Poletta, Camino; Mario Sartori, Turin; Marco Siligoni, Vittuone, all of Italy

[73] Assignee: Cselt - Centro Studi e Laboratori Telecomunicazioni S.p.A., Turin, Italy

[21] Appl. No.: 609,189

[22] Filed: May 11, 1984

[30] Foreign Application Priority Data

May 12, 1983 [IT] Italy .............................. 67531 A/83

[51] Int. Cl.[4] .......................... H03K 3/36; H04B 1/38; H04L 5/14; H04J 15/00

[52] U.S. Cl. ...................................... 307/297; 307/32; 307/443; 307/242; 307/264; 323/317; 330/288; 370/32; 455/73

[58] Field of Search ............... 307/296 R, 296 A, 297, 307/242, 491, 443, 455, 264, 466, 32, 34; 323/312–317; 370/24, 26, 27, 32, 119; 375/8; 455/90, 73; 330/257, 288

[56] References Cited

U.S. PATENT DOCUMENTS

| | | | |
|---|---|---|---|
| 3,275,840 | 9/1966 | Harding et al. | 307/270 |
| 3,319,177 | 5/1967 | Aemmer | 307/297 |
| 3,383,612 | 5/1968 | Harwood | 323/315 X |
| 3,617,859 | 11/1971 | Dobkin et al. | 323/313 |
| 3,743,850 | 7/1973 | Davis | 307/297 X |
| 3,936,725 | 2/1976 | Schneider | 323/315 |
| 4,112,253 | 9/1978 | Wilhelm | 370/27 |
| 4,237,414 | 12/1980 | Stein | 323/312 |
| 4,277,739 | 7/1981 | Priel | 323/314 X |
| 4,325,019 | 4/1982 | Tezuka | 307/296 R X |
| 4,349,778 | 9/1982 | Davis | 323/314 |
| 4,354,122 | 10/1982 | Embree et al. | 307/264 X |
| 4,370,608 | 1/1983 | Nagano et al. | 323/314 X |
| 4,393,494 | 7/1983 | Belforte et al. | 370/32 X |
| 4,458,201 | 7/1984 | Koen | 323/314 X |
| 4,471,237 | 9/1984 | Kaplan | 307/454 X |
| 4,498,001 | 2/1985 | Smoot | 330/288 X |

FOREIGN PATENT DOCUMENTS

| | | | |
|---|---|---|---|
| 2080063 | 1/1982 | United Kingdom | 323/316 |
| 2086682 | 5/1982 | United Kingdom | 323/316 |
| 2096803 | 10/1982 | United Kingdom | 323/316 |

OTHER PUBLICATIONS

IEEE Journal of Solid–State Circuits, vol. SC–8, No. 5, Oct. 1973, pp. 362–367, H. H. Muller et al.

Article entitled "Fully Compensated Emitter–Coupled Logic: . . . ", by Harold Muller et al., IEEE Journal of Solid–State Circuits, vol. SC–8, No. 5, Oct. 1973.

*Primary Examiner*—Stanley D. Miller

*Assistant Examiner*—David R. Bertelson

*Attorney, Agent, or Firm*—Karl F. Ross; Herbert Dubno

[57] ABSTRACT

A network for supplying identical biasing voltages and programmable direct currents to a plurality of mutually similar transceivers, connected across respective transmission lines, is integrated with the associated transceivers in a common semiconductor body and comprises a generator of fixed reference voltage determined by the band gap of the semiconductor. The reference voltage is applied in parallel to the bases of several NPN transistors emitting the same biasing voltage as a result thereof. This reference voltage also drives an NPN pilot transistor lying in series with an external resistor through which it draws a small programmed current. Through two cascaded amplification stages formed by NPN transistors operating in the ECL mode, with the second stage designed as a multiple-output current mirror, the programmed current is stepped up to provide the several direct currents required by the associated transceivers.

4 Claims, 3 Drawing Figures

BIASING NETWORK FOR MULTIFUNCTION BIPOLAR INTEGRATED SYSTEM

FIELD OF THE INVENTION

Our present invention relates to a biasing network forming part of a multifunction bipolar integrated system in which a plurality of substantially identical circuit components are to be supplied with fixed reference potentials—equal for all components—and with direct operating currents which may be differently programmed for the several components.

BACKGROUND OF THE INVENTION

In such a system it is extremely desirable that the reference voltage identically fed to all components be virtually invariable, i.e. substantially unaffected by changes in supply voltage and temperature. Another important requirement is to prevent so-called cross-talk among the several components, i.e. mutual interference in their operations, even when their reference potentials or biasing voltages are delivered by a common source.

An article titled "Fully Compensated Emitter-Coupled Logic: Eliminating the Drawbacks of Conventional ECL" by Harold H. Muller et al, published October 1973, IEEE Journal of Solid-State Circuits, Vol. SC-8, No. 5, pages 362–367, describes a circuit arrangement with a multiplicity of transistors—mostly of NPN conductivity type—generating stabilized voltages which are substantially invariant over wide ranges of ambient temperature and supply voltage. The transistors draw high currents and no means are included for feeding programmable currents to other circuit components.

Biasing circuits for ECL line drivers and receivers, marketed under the designation F10K by Fairchild Industries, do not generate stable reference voltages or programmable currents. Such programmability is provided in a biasing circuit marketed under the designation LH146 by National Semiconductors Corp.; there, too, no stabilized voltages are generated and the emitter currents are affected by variations in the supply voltage.

A particular instance of circuit components requiring fixed biasing voltages and preferably programmable operating currents are transceivers connected across outgoing transmission lines as described in commonly owned U.S. patent application Ser. No. 552,499 filed Nov. 17, 1983 by Piero Belforte (now U.S. Pat. No. 4,593,211 issued June 3, 1986). In such a transceiver, an input stage comprises a pair of control transistors connected to a pair of driving transistors in an output stage, the two latter transistors being alternately connectable through a main constant-current generator across the associated transmission line in dependence upon an incoming signal applied to one of the control transistors. The input stage further includes an ancillary constant-current generator feeding the two control transistors while two other constant-current generators in the output stage serve to maintain the inactive driving transistors is performed by a further transistor pair. The several ancillary current generators deliver only small currents, compared with the line current supplied by the main generator, and are under the control of fixed biasing voltages. The transceiver may be part of a full-duplex transmission system of the type disclosed in commonly owned U.S. Pat. No. 4,393,494 in the names of Piero Belforte et al.

OBJECTS OF THE INVENTION

The general object of our present invention is to provide a biasing network which can be integrated with the associated circuit components in a unitary semiconductor body for supplying these components with a fixed biasing voltage and individually programmable operating currents as discussed above.

A more particular object is to provide a biasing network serving a plurality of transceivers of the kind disclosed in the above-identified Beltforte application.

SUMMARY OF THE INVENTION

Pursuant to our present invention, a biasing network for the purpose set forth comprises a source of direct current having two supply leads of negative and positive relative polarity, respectively. A voltage generator, including transistor means connected across these supply leads, produces a fixed reference voltage which is determined by the band gap of the semiconductor material of the body in which it is integrated. A plurality of first output transistors have collectors connected to one supply lead, bases connected in parallel to the reference-voltage generator, and emitters connected to first terminals of respective associated circuit components to be supplied with an identical biasing voltage. A pilot transistor, connected across the supply leads in series with an external resistor, draws a small programmation current under the control of the reference voltage which is fed to its base by the aforementioned generator. With the aid of amplifier means connected to the pilot transistor, and including in a final stage a plurality of second output transistors that are inserted in series with respective emitter resistors between the other supply lead and second terminals of respective associated circuit components, the programmed current is stepped up to generate direct currents which are supplied to the associated circuit components and which are programmable by the magnitudes of the corresponding emitter resistors. A further terminal of each circuit component may also be connected to the biasing network for receiving therefrom a fixed potential, derived from the reference voltage, which lies between levels of incoming binary signals.

Advantageously, the programmable direct currents are decoupled from the small programmed current, giving rise thereto, by a circuit which may comprise a transistorized current mirror with base-current feedback. When the first output transistors have their collectors connected to the more positive supply lead and the second output transistors have their emitter resistors tied to the more negative supply lead (all these output transistors being of NPN type), as in the preferred embodiment described hereinafter, the transistors of that current mirror will be of PNP type. An input stage of the amplifier means may then comprise a floating NPN current mirror in cascade with the PNP current mirror.

BRIEF DESCRIPTION OF THE DRAWING

The above and other features of our invention will now be described in detail with reference to the accompanying drawing in which.

SPECIFIC DESCRIPTION

Figure 1:
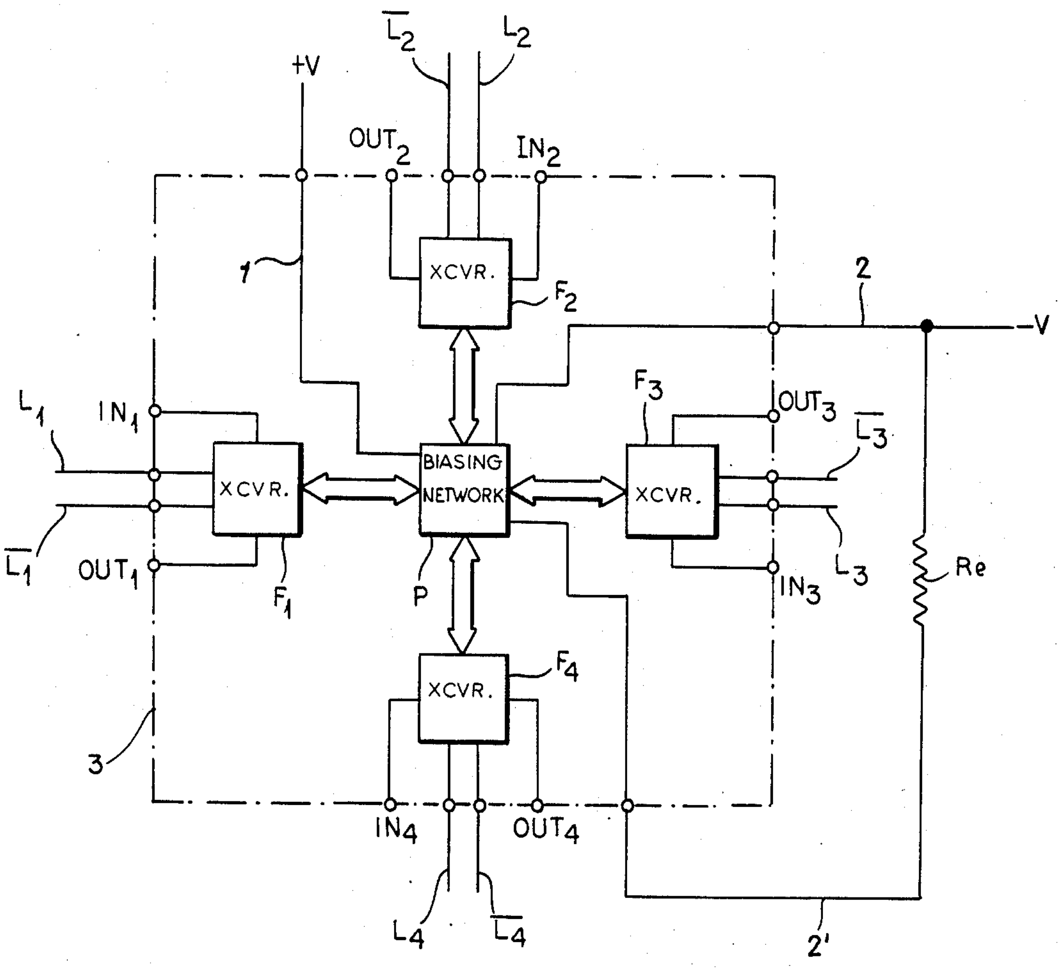
FIG. 1 is a block diagram showing a semiconductor body with four transceivers and a common biasing network according to this invention integrated therein.

As shown in FIG. 1, a semiconductor body 3 has integrated therein a biasing network P serving four transceivers $F_1$–$F_4$, each transceiver being connected across a respective transmission line with conductors $L_1$, $\overline{L_1}$; $L_2$, $\overline{L_2}$; $L_3$, $\overline{L_3}$; $L_4$, $\overline{L_4}$. Each transceiver further has an input terminal, designated $IN_1$–$IN_4$, to which an incoming signal to be transmitted over the associated line (as more fully described hereinafter with reference to FIG. 3) is applied, as well as an output terminal, designated $OUT_1$–$OUT_4$, on which a signal received from the line is present in a full-duplex system such as that of the aforementioned U.S. Pat. No. 4,393,494.

Other terminals not particularly indicated in FIG. 1, connected at each transceiver to network P via a bus represented by a double arrow, include control inputs receiving fixed biasing voltages and an operating input receiving a programmed direct current.

As further shown in FIG. 1, network P is energized from a nonillustrated d-c source by two supply leads 1 and 2 carrying respective voltages +V and −V. Lead 2 has an extension 2' connected back to network P by way of an external programmed resistor Re.

Figure 2:
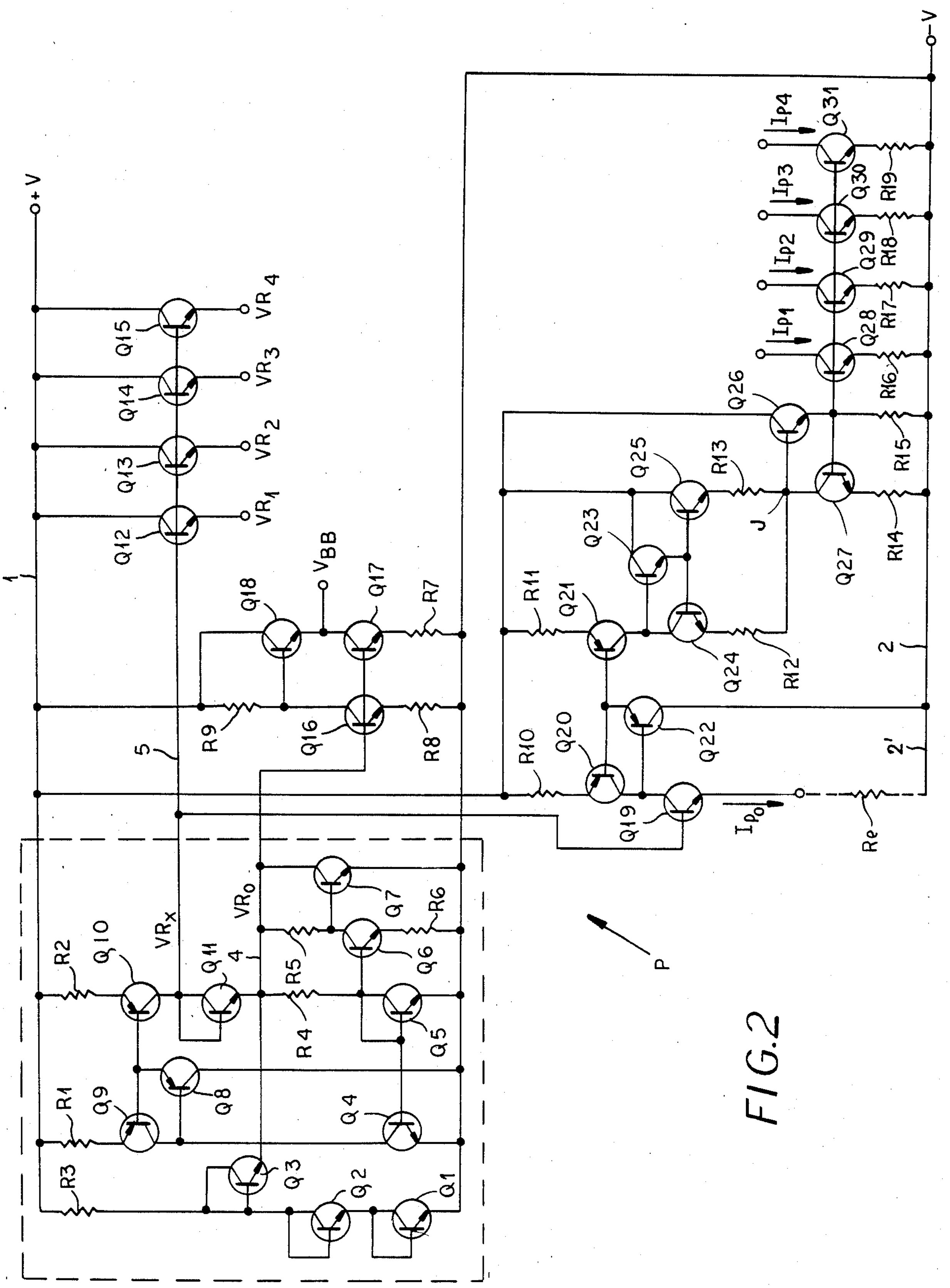
FIG. 2 is a detailed circuit diagram of the biasing network shown in FIG. 1.

As seen in FIG. 2, biasing network P comprises a multiplicity of transistors Q1–Q31 and resistors R1–R19. NPN transistors Q1–Q3, all connected as diodes, form part of a starting circuit for a voltage-level generator comprising NPN transistors Q5–Q7; the starting circuit also includes the resistor R3 lying in series with diodes Q1 and Q2 between positive lead 1 and negative lead 2. PNP transistors Q9 and Q10, with emitters connected to lead 1 via resistors R1 and R2, form a current mirror with base-current feedback from the collector of transistor Q9 by way of PNP transistor Q8 whose collector is tied to lead 2. The collector of transistor Q9 is connected to the collector of NPN transistor Q4 whose emitter is tied to lead 2 which with transistor Q5 constitutes a second current mirror; transistor Q5, whose emitter is also tied to lead 2, has its collector connected to the collector of transistor Q10 by way of NPN transistor Q11 also connected as a diode. The emitters of transistors Q3 and Q11 are jointed at an internal lead 4 to which the collectors of transistors Q5 and Q6, via respective resistors R4 and R5, as well as the collector of transistor Q7 are also connected. The emitters of transistors Q6 and Q7 are connected to lead 2, with interposition of resistor R6 in the case of the former.

Transistors Q4–Q7 constitute a so-called Widlar mirror giving rise to a fixed reference voltage $VR_0$, determined by the band gap of the semiconductor material as is well known per se, on internal lead 4. When power is first supplied, transistors Q5–Q7 are all made conductive via diode Q3, bringing on the transistor Q4 which in turn causes transistors Q5, Q9 and Q10 to conduct. The two latter transistors operate with a current ratio of about 1:2.5 (in contrast to the 1:1 ratio of current mirror Q4, Q5), with resulting increase in the potential of lead 4 and cutoff of diode Q3. The stabilized reference voltage $VR_0$ on lead 4 is reflected in a higher (more positive reference voltage $VR_x$ on another internal lead 5, connected to the collector junction of transistors Q10 and Q11. This lead 5 extends to the bases of four NPN output transistors Q12–Q15, with collectors tied to lead 1, whose emitters deliver respective biasing voltages $VR_1$–$VR_4$ of identical magnitude to the control inputs of components $F_1$–$F_4$ of FIG. 1.

The common-collector mode of connection of output transistors Q12–Q15 effectively decouples their emitters from one another so as to inhibit mutual interference.

Lead 4 extends to the bases of NPN transistors Q16, Q17; the collector of transistor Q16 is connected to positive supply lead 1 via resistor R9 while the collector of transistor Q17 is connected to the same supply lead by way of NPN transistor Q18 in series therewith. The collector and base of transistor Q18 are connected across resistor R9; thus, the junction of the emitter of transistor Q18 with the collector of transistor Q17 is at a fixed potential $V_{BB}$ supplied as a reference to nonillustrated terminals of components $F_1$–$F_4$ (FIG. 1).

Lead 5 is further joined to the base of an NPN pilot transistor, namely element Q19, whose collector is connected in series with PNP transistor Q20 and its emitter resistor R10 to positive supply lead 1. The emitter of transistor Q19 is tied to lead extension 2' containing the external resistor Re which is of sufficient magnitude to let only a small programmed current $Ip_0$, on the order of some hundred microamperes, traverse the two series transistors Q19 and Q20. Such a current, in fact, lies in a region of maximum gain for PNP transistors Q20–Q22 constituting a decoupling circuit; transistors Q20 and Q21 form a current mirror with base-current feedback through transistor Q22 whose base is tied to the collector junction of transistors Q19, Q20 and whose collector is connected to negative supply lead 2. The emitter of transistor Q21 is connected to positive supply lead 1 by way of resistor R11.

In order to generate four output currents of, say, up to some 15 mA to be delivered to components $F_1$–$F_4$ of FIG. 1, the small programmed current $Ip_0$ must be stepped up about 100 times. A partial step-up may occur in PNP mirror Q20, Q21 with suitable choice of emitter resistors R10, R11. The collector of transistor Q21 is joined to that of NPN transistor Q24 and to the base of NPN transistor Q23 which provides base-current feedback for a floating current mirror consisting of NPN transistors Q24 and Q25. The collectors of transistors Q23 and Q25 are tied directly to supply lead 1 whereas the emitters of transistors Q24 and Q25 are connected to a junction point J via resistors R12 and R13, respectively. With suitable choice of these emitter resistors, current mirror Q24, Q25 can have an amplification ratio of 10:1 so that the current at junction point J is about 11 times as high as that supplied by PNP transistor Q21.

Floating mirror Q24, Q25 thus constitutes a first amplifier stage which is followed by a second or final amplifier stage constituted by a multiple-output current mirror comprising NPN transistors Q27–Q31, with NPN transistor Q26 supplying base-current feedback. The input transistor Q27 of this current mirror has its collector tied to junction point J and its emitter connected to supply lead 2 via resistor R14. This junction point is also connected to the base of transistor Q26 whose collector is joined to supply lead 1 and whose emitter, along with all the bases of mirror transistors Q27–Q31, is connected to lead 2 by way of resistor R15. Elements Q28–Q31, constituting a second set of output transistors, are connected to lead 2 through resistors R16–R19, respectively; their collectors are joined to operating terminals of components $F_1$–$F_4$, FIG. 1, from which they draw line currents $I_{P1}$–$I_{P4}$ programmed by the magnitudes of their respective emitter resistors.

Thus, the decoupling and amplifying circuitry Q19–Q31, R10–R19 enables the generation of four programmable direct currents under the control of a single external resistor Re. These currents are completely independent of one another, with avoidance of any cross-talk. The two-stage amplification of the small current $I_{P0}$ affords considerable saving in semiconductor area and an overall reduction of power consumption in comparison with a circuit arrangement using four separate external resistors for generating the respective output currents with a lower step-up ratio.

Figure 3:
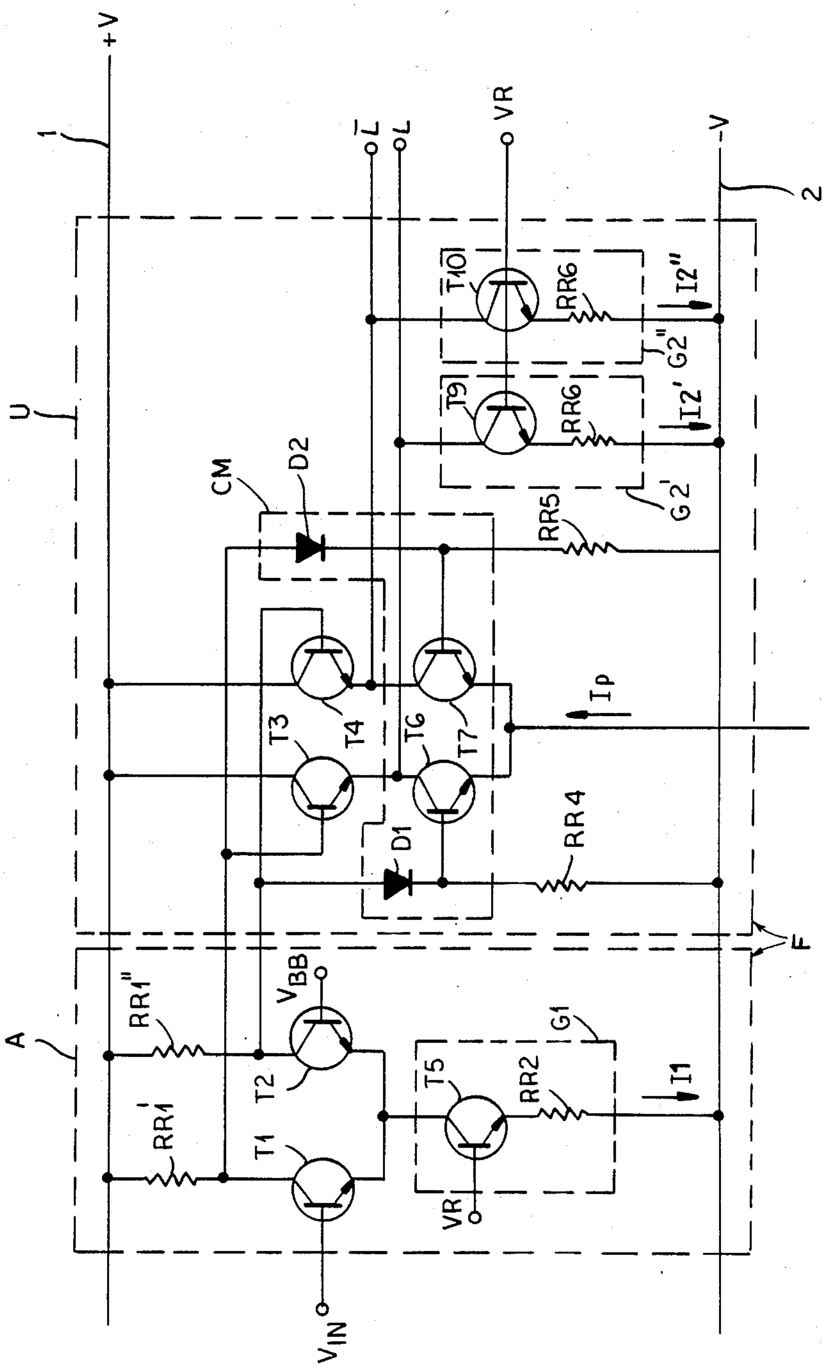
FIG. 3 is a circuit diagram of a transmitting section of a transceiver as disclosed in the above-identified Beltforte application, modified to receive biasing voltage and operating current from the network of FIG. 2.

We shall now describe, with reference to FIG. 3, a transceiver F representative of any of components $F_1$–$F_4$ shown in block form in FIG. 1. This transceiver corresponds in substrate to an embodiment of an ECL circuit arrangement for the transmission and reception of binary signals disclosed in Belforte application Ser. No. 552,499 already referred to. It has an input stage A, comprising a pair of NPN control transistors T1, T2 connected in series with respective collector resistors RR1′, RR1″ and a common constant-current generator G1 between supply leads 1 and 2, and an output stage U, comprising a pair of NPN driving transistors T3, T4 with collectors connected to positive lead 1 and with emitters respectively tied to wires L and $\overline{L}$ of the associated transmission line. These emitters are alternately connectable, by a commutator CM in series with a constant-current source represented by one of the output transistors Q28–Q31 of FIG. 2, to negative lead 2 for completing a circuit letting signal current pass in one direction or the other over transmission line L, $\overline{L}$. The switchover between driving transistors T3 and T4 is determined by the level of an incoming binary signal $V_{IN}$ which, with lead 1 grounded as assumed in the above-identified application, may vary between a high of −0.8 V and a low of −1.6 V. The incoming signal is applied via the corresponding terminal IN (FIG. 1) to the base of control transistor T1 while a constant intermediate voltage of −1.2 V, namely the reference potential $V_{BB}$ generated by the biasing network P of FIG. 2, is and delivered to the corresponding terminal connected to the base of companion transistor T2.

As shown in FIG. 3, commutator CM comprises two NPN switching transistors T6 and T7 lying respectively in series with driving transistors T3 and T4, their emitters being connected in parallel to the collector of the NPN output transistor of network P of FIG. 2 generating the operating or line current Ip. The emitter resistor of that output transistor, connected to lead 2, has been suitably chosen to provide a desired operating current of, say, 10 mA.

The collectors of switching transistors T6 and T7 are respectively connected to line wires L, $\overline{L}$ and thus to the emitters of driving transistors T3 and T4. The base of transistor T6 is connected to the cathode of a diode D1 whose anode is joined to the collector of control transistor T2 and to the base of driving transistor T4, the forward resistance of this diode thus forming part of a biasing circuit which further includes a high-ohmic resistor RR4 inserted between its cathode and supply lead 2. A similar biasing circuit, including a diode D2 in series with a high-ohmic resistor RR5, extends between the collector of control transistor T1 and lead 2; the forward resistance of diode D2, therefore, lies between the bases of transistors T3 and T7. This cross-connection of the two diodes between the bases of driving transistors T3, T4 and those of the respectively opposite switching transistors T7, T6 insures a virtually simultaneous changeover from high to low conductivity, or vice versa, of the two transistors through which the line current must pass with a given value of incoming signal $V_{IN}$, thereby facilitating signal transmission at high speed.

FIG. 3 further shows two low-current generators G2′ and G2″ respectively inserted between negative lead 2 and the emitters of transistors T3 and T4. Ancillary current generator G1 and supplemental generators G2′, G2″ are of essentially identical structure, comprising respective NPN transistors T5, T9 and T10 in series with associated emitter resistors RR2, RR6 and RR7. Fixed and identical biasing voltages VR, respectively applied to the bases of transistor T5 and of transistors T9, T10 from one of the output transistors Q12–Q15 of FIG. 2, are chosen to maintain their operating currents I1 and I2′, I2″ at a small fraction of line current Ip, e.g. at 1 mA in each instance.

If it is assumed that each collector resistor RR1′, RR1″ has a magnitude of 800Ω and that the voltage drop across each diode D1, D2 in the forward direction equals 0.7 V, a high level of incoming signal $V_{IN}$(−0.8 V) will let virtually the entire operating current I1 of generator G1 pass through transistor T1 so as to produce a voltage of −0.8 V on the collector of that control transistor and on the base of driving transistor T3; the base voltage of switching transistor T7 correspondingly assumes a value of −1.5 V. Conversely, the substantial cutoff of control transistor T2 brings the base of driving transistor T4 approximately to ground potential while the base of switching transistor T6 is at about −0.7 V. The two latter transistors are therefore in their low-impedance state so that line current mainly flows from ground on positive supply lead 1 via transistor T4 to wire $\overline{L}$ and from wire L via transistor T6 and the current-emitting output transistor of network P to negative supply lead 2. A small additional current passes from transistor T4 through supplemental generator G2″ directly to lead 2. The continuity of conduction of transistor T3 is maintained by a similarly small flow through supplemental generator G2′ while a minor fraction of the current drawn by network P also traverses the switching transistor T7 which is not completely cut off. When signal $V_{IN}$ goes low, i.e. to −1.6 V as herein assumed, the states of conductivity of transistors T1–T4, T6 and T7 are reversed.

We claim:

1. An integrated circuit comprising:

a unitary semiconductor body;

a plurality of substantially identical circuit elements integrated in said body and connected to be energized with biasing voltages, fixed currents and programmable currents;

a reference-voltage generator integrated in said body for generating a stabilized reference voltage;

first transistors integrated in said body and connected to said reference-voltage generator and controlled by said stabilized reference voltage for delivering respective biasing voltages of identical magnitudes to control inputs of all of said circuit elements, said first transistors effectively maintaining said control inputs decoupled from one another in spite of the application to said control inputs of identical bias voltages;

second transistors integrated in said body and connected to said reference-voltage generator and controlled by said stabilized reference voltage for producing a small current; and a two-stage amplifier comprised of third transistors integrated in said body and connected to said second transistors and receiving said small current and amplifying same, said third transistors including respective output transistors programmable by respective resistors in circuit therewith and applying respective programmable currents to drive inputs of said circuit elements, said output transistors effectively maintaining said drive inputs decoupled from one another in spite of the application to said drive inputs of said programmable currents derived from a common first stage of said amplifier.

2. In combination, a plurality of substantially identical circuit components including transceivers connected across respective transmission lines and associated with a common biasing network, all integrated in a unitary semiconductor body, said biasing network comprising:

a source of direct current having two supply leads of a positive and a negative relative polarity, respectively;

a voltage generator including transistor means connected across said supply leads for producing a fixed reference voltage determined by a band gap of the semiconductor of said body, said voltage generator comprising a set of transistors interconnected as a Widlam mirror and provided with a starting circuit;

a plurality of NPN first output transistors with collectors connected to one of said supply leads, bases connected in parallel to said generator for receiving said reference voltage therefrom, and emitters connected to first terminals of respective associated circuit components for energizing same with an identical biasing voltage controlled by the refernce voltage supplied to said bases;

a pilot transistor connected across said supply leads in series with an external resistor for drawing a small programmed current under the control of said reference voltage applied to a base thereof by said voltage generator;

amplifier means connected to said pilot transistor for stepping up said programmed current, said amplifier means including a final stage a plurality of second NPN output transistors inserted in series with respective emitter resistors between the other of said supply leads and second terminals of respective associated circuit components for energizing same with respective direct currents programmable by the magnitudes of said emitter resistors; and a decoupling circuit inserted between said pilot transistor and said amplifier means, said decoupling circuit comprising a PNP current mirror with base-current feedback.

3. The combination defined in claim 1 wherein said amplifier means includes an input stage comprising a floating NPN current mirror in cascade with said PNP current mirror.

4. The combination defined in claim 1 wherein each of said transceivers has an input terminal connected to a source of incoming binary signals and a further terminal connected to said biasing network for receiving therefrom a fixed potential derived from said reference voltage, said fixed potential lying between the binary levels of said incoming signals.

* * * * *